US012691869B2

(12) United States Patent (10) Patent No.: US 12,691,869 B2
Masuda et al. (45) Date of Patent: Jul. 28, 2026

(54) METRIC LEARNING PREDICTION OF SIMULATION PARAMETERS

(71) Applicant: INTERNATIONAL BUSINESS MACHINES CORPORATION, Armonk, NY (US)

(72) Inventors: Satoshi Masuda, Tokyo (JP); Takayuki Katsuki, Tokyo (JP); Kugamoorthy Gajananan, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 762 days.

(21) Appl. No.: 16/438,999

(22) Filed: Jun. 12, 2019

(65) Prior Publication Data

US 2020/0393840 A1 Dec. 17, 2020

(51) Int. Cl.
| | |
|---|---|
| *B60W 30/09* | (2012.01) |
| *G06F 17/18* | (2006.01) |
| *G06F 30/20* | (2020.01) |
| *G06F 30/27* | (2020.01) |
| *G06N 20/10* | (2019.01) |
| *G06V 20/58* | (2022.01) |

(52) U.S. Cl.
CPC ............. *B60W 30/09* (2013.01); *G06F 17/18* (2013.01); *G06F 30/20* (2020.01); *G06F 30/27* (2020.01); *G06N 20/10* (2019.01); *G06V 20/58* (2022.01)

(58) Field of Classification Search
None
See application file for complete search history.

(56) References Cited

U.S. PATENT DOCUMENTS

| | | | | |
|---|---|---|---|---|
| 10,366,502 B1 * | 7/2019 | Li | ............................ | G06N 3/04 |
| 10,878,346 B2 * | 12/2020 | Hsu | ........................ | G06N 20/10 |
| 11,216,888 B2 * | 1/2022 | Perl | .......................... | G06N 3/08 |
| 11,312,374 B2 * | 4/2022 | Zhao | ....................... | G06F 17/18 |
| 11,648,962 B1 * | 5/2023 | Crego | ................... | B60W 30/09 |
| | | | | 701/26 |
| 11,782,158 B2 * | 10/2023 | Lee | ........................... | G06N 7/01 |
| | | | | 356/28.5 |
| 2008/0172177 A1 | 7/2008 | Sherony et al. | | |
| 2014/0095132 A1 * | 4/2014 | Fu | ........................... | G06F 17/18 |
| | | | | 703/6 |
| 2014/0114885 A1 * | 4/2014 | Han | ....................... | G06N 20/10 |
| | | | | 706/20 |
| 2017/0193138 A1 * | 7/2017 | Katsuki | ................... | G06F 17/10 |
| 2017/0228639 A1 * | 8/2017 | Hara | ....................... | G06N 3/08 |
| 2018/0229723 A1 * | 8/2018 | Jiang | ................... | G05D 1/0257 |

(Continued)

OTHER PUBLICATIONS

Wikipedia—Dynamic time Warping pp. 11 (Year: 2025).*

(Continued)

*Primary Examiner* — Akash Saxena
(74) *Attorney, Agent, or Firm* — CHIP LAW GROUP

(57) ABSTRACT

Predicting simulation parameters is performed by obtaining a plurality of datasets, each dataset including simulation parameters, time series data and a label. Wherein the time series data represents a simulation status for each time and the label represents a simulation result. Learning a metric of the simulation parameters including two datasets of the plurality of datasets. Wherein the metric imitates the similarity of time series data of the two datasets, and training a model for predicting the label for simulation parameters by using the metric.

17 Claims, 9 Drawing Sheets

(56) References Cited

U.S. PATENT DOCUMENTS

| | | | | |
|---|---|---|---|---|
| 2018/0284785 A1* | 10/2018 | Berntorp | .................. | G06N 3/08 |
| 2019/0049980 A1* | 2/2019 | Chen | ......................... | G06N 3/00 |
| 2019/0102840 A1* | 4/2019 | Perl | ........................... | G07C 5/02 |
| 2019/0129432 A1* | 5/2019 | Russell | .................... | G06F 18/23 |
| 2019/0332109 A1* | 10/2019 | Kolouri | .................. | G06N 3/044 |
| 2020/0133269 A1* | 4/2020 | Wang | ..................... | G06N 3/045 |
| 2020/0225668 A1* | 7/2020 | Masuda | .............. | G05D 1/0214 |
| 2020/0364469 A1* | 11/2020 | Fowe | ...................... | G06F 16/29 |
| 2020/0379471 A1* | 12/2020 | Abendroth | ............. | G06N 3/045 |
| 2021/0241616 A1* | 8/2021 | Abdulhai | .............. | G06N 3/0454 |
| 2021/0287459 A1* | 9/2021 | Cella | ..................... | G07C 5/0808 |
| 2021/0326703 A1* | 10/2021 | Zimmer | ................... | G06N 3/08 |
| 2021/0370980 A1* | 12/2021 | Ramamoorthy | ....... | G06N 20/00 |
| 2022/0119006 A1* | 4/2022 | Ariyaratne | ............ | B60W 30/09 |
| 2022/0227397 A1* | 7/2022 | Jiang | ................... | G06F 11/3013 |
| 2024/0202571 A1* | 6/2024 | Yaghi | ...................... | G06F 18/22 |
| 2025/0005462 A1* | 1/2025 | Bhattacharya | ........... | G06N 7/01 |

OTHER PUBLICATIONS

Chen et al., "Model Metric Co-Learning for Time Series Classification", Proceedings of the 24th International Joint Conference on Artificial Intelligence. Jun. 27, 2015. pp. 1-8.

Hu et al., "Coordinated collision avoidance for connected vehicles using relative kinetic energy density", International Journal of Automotive Technology. vol. 18, No. 5. Feb. 17, 2017. pp. 923-932.

Rakthanmanon et al., "Data Mining a Trillion Time Series Subsequences Under Dynamic Time Warping", Proceedings of the 23rd International Joint Conference on Artificial Intelligence. Jun. 30, 2013. pp. 3047-3051.

Sebastian et al., "Multi-Vehicles Interaction Graph Model for Cooperative Collision Warning System", 2009 IEEE Intelligent Vehicles Symposium. Jun. 23, 2009. pp. 929-934.

Strickland et al., "Deep Predictive Models for Collision Risk Assessment in Autonomous Driving", 2018 IEEE International Conference on Robotics and Automation. Mar. 29, 2018. pp. 1-8.

Wang et al., "Cooperative Collision Avoidance for Multi-Vehicle Systems Using Reinforcement Learning", 2013 18th International Conference on Methods & Models in Automation & Robotics. Aug. 26, 2013. pp. 98-102.

* cited by examiner

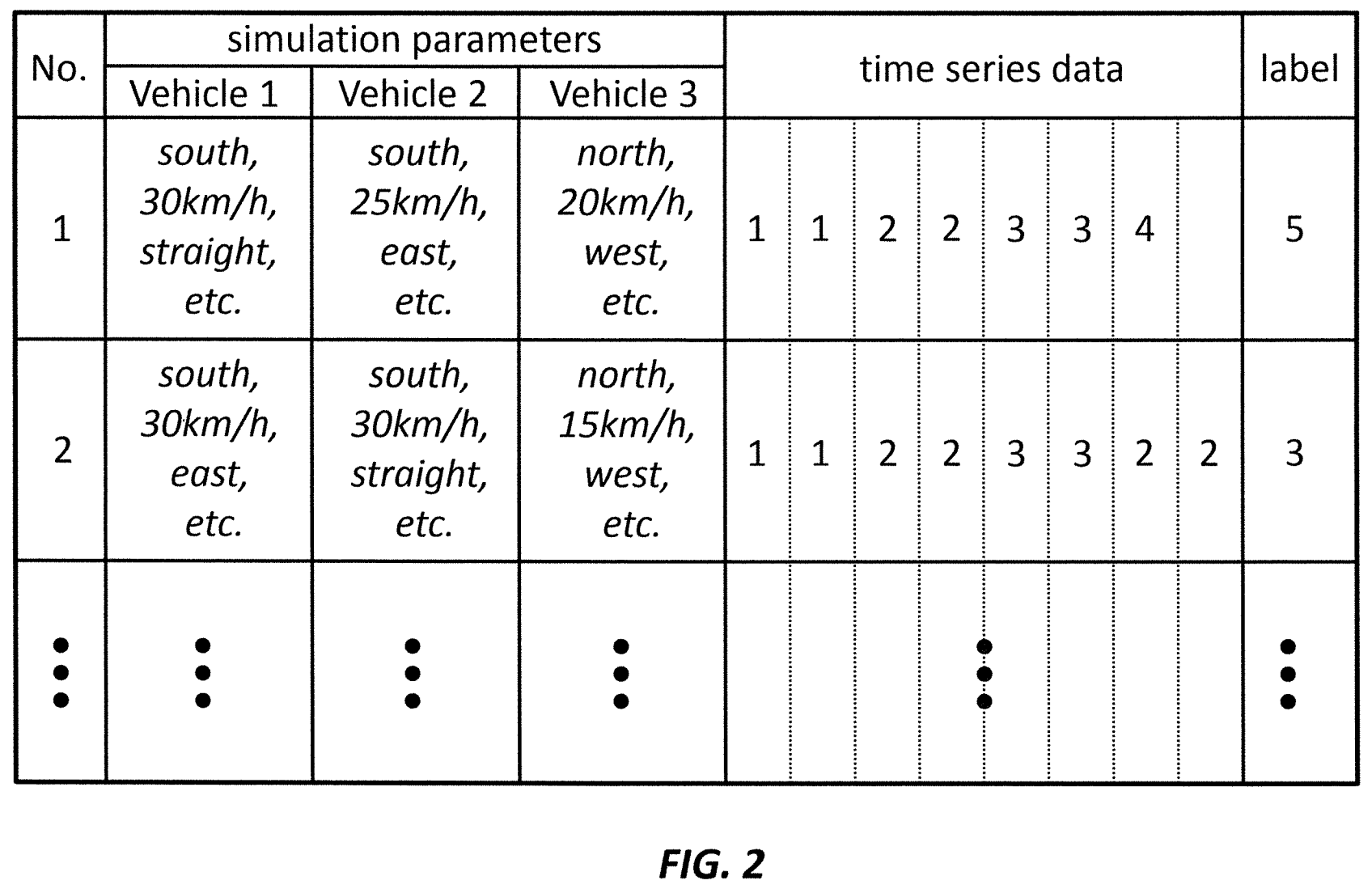

| No. | simulation parameters | | | time series data | | | | | | | | label |
|---|---|---|---|---|---|---|---|---|---|---|---|---|
| | Vehicle 1 | Vehicle 2 | Vehicle 3 | | | | | | | | | |
| 1 | south, 30km/h, straight, etc. | south, 25km/h, east, etc. | north, 20km/h, west, etc. | 1 | 1 | 2 | 3 | 3 | 4 | | | 5 |
| 2 | south, 30km/h, east, etc. | south, 30km/h, straight, etc. | north, 15km/h, west, etc. | 1 | 1 | 2 | 3 | 3 | 2 | 2 | | 3 |
| ••• | ••• | ••• | ••• | | | | ••• | | | | | ••• |

*FIG. 2*

START

S400

S410 — Obtain datasets

S420 — Learn a metric of simulation parameters

S430 — Train a model for predicting a label for simulation parameters

S440 — Determine new simulation parameters

S450 — Perform a simulation for the new simulation parameters

S460 — Add the new simulation parameters to the dataset storage

S470

END

START

S600 — Create sets of candidate simulation parameters

S610 — Predict a label for each set of candidate simulation parameters

S620 — Select new simulation parameters based on predicted labels

END

1200

METRIC LEARNING PREDICTION OF SIMULATION PARAMETERS

BACKGROUND

The present invention relates to predicting simulation parameters by metric learning. More specifically, the present invention relates to predicting simulation parameters based on a metric between sets of simulation parameters.

In many technical fields, simulators can be used to simulate behaviors (e.g., movements, status changes, and so on) of real world objects. Simulators may simulate behaviors of real world objects for each time step in a certain time period, and output a simulation status for each time step. By using simulators, experimenters may not need to prepare real world environments, and therefore the time and cost of experiments can be dramatically reduced.

The results of simulations can be different if different sets of simulation parameters are used as initial states of simulated objects. For example, the results of a collision simulation of vehicles can be very different if at least one of initial positions, initial speeds, or initial directions of the vehicles are different. Finding simulation parameters that cause a certain result may need running many different simulation parameters in hopes that the desired result is caused. Therefore, trying to find multiple sets of simulation parameters that cause a certain result may need lots of computational resources.

SUMMARY

According to an embodiment of the present invention, provided is a computer-implemented method comprising obtaining a plurality of datasets, each dataset including simulation parameters, time series data and a label. Wherein the time series data represents a simulation status for each time step and the label represents a simulation result. The method further includes learning a metric of the simulation parameters of at least two datasets of the plurality of datasets. Wherein the metric imitates the similarity of time series data of the at least two datasets. The method further includes training a model for predicting the label for simulation parameters by using the metric.

According to another embodiment of the present invention, provided is a computer program product including one or more computer readable storage mediums collectively storing program instructions that are executable by a processor or programmable circuitry to cause the processor or programmable circuitry to perform operations comprising obtaining a plurality of datasets, each dataset including simulation parameters, time series data and a label. Wherein the time series data represents a simulation status for each time step and the label represents a simulation result. The operations further include learning a metric of the simulation parameters of at least two datasets of the plurality of datasets. Wherein the metric imitates the similarity of time series data of the at least two datasets. The operations further include training a model for predicting the label for simulation parameters by using the metric.

According to another embodiment of the present invention, provided is an apparatus comprising a processor or a programmable circuitry and one or more computer readable mediums collectively including instructions that, when executed by the processor or the programmable circuitry, cause the processor or the programmable circuitry to obtain a plurality of datasets, each dataset including simulation parameters, time series data and a label. Wherein the time series data represents a simulation status for each time step and the label represents a simulation result. The instructions to further cause the processor or the programmable circuitry to learn a metric of the simulation parameters of at least two datasets of the plurality of datasets. Wherein the metric imitates the similarity of time series data of the at least two datasets. The instructions to further cause processor or the programmable circuitry to further train a model for predicting the label for simulation parameters by using the metric.

The summary clause does not necessarily describe all necessary features of the embodiments of the present invention. Not all features described in the summary are essential to the present invention. The present invention may also be a sub-combination of the features described above.

BRIEF DESCRIPTION OF THE DRAWINGS

FIG. 2 shows an example of datasets according to an embodiment of the present invention.

DETAILED DESCRIPTION

Hereinafter, example embodiments of the present invention will be described. The example embodiments shall not limit the invention according to the claims, and the combinations of features described in the embodiments are not necessarily essential to the invention.

Figure 1:
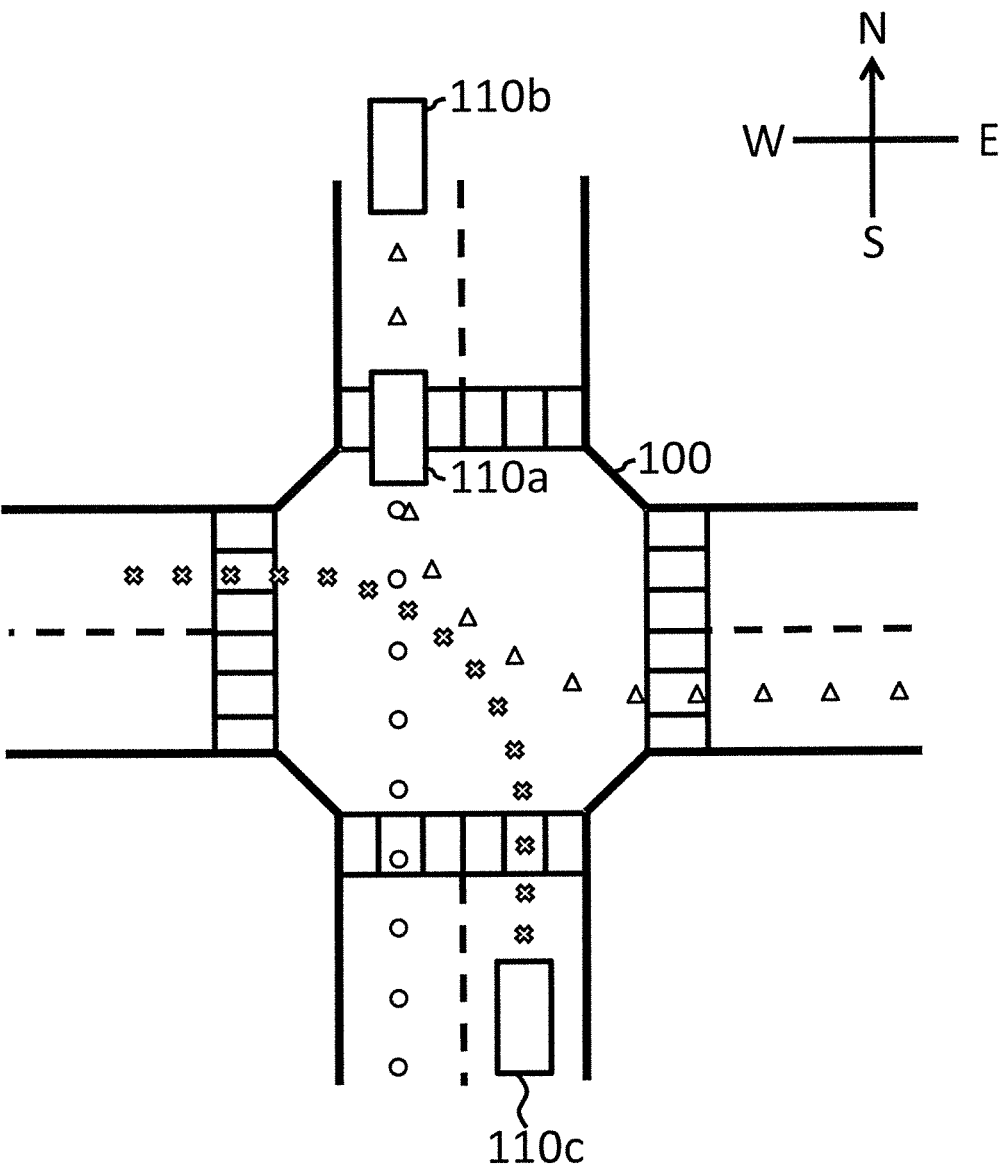
FIG. 1 shows an example of a simulation experiment according to an embodiment of the present invention.

FIG. 1 shows an example of a simulation experiment according to an embodiment of the present invention. In this example, reactions and collisions of vehicles 110a, 110b, and 110c (e.g., cars) at intersection 100 are simulated.

Intersection 100 is a four-way intersection which is an intersection of a road of north-south direction and a road of east-west direction. In this example, vehicle 110a comes to intersection 100 from the north, and goes straight south at intersection 100. Vehicle 110b comes to intersection 100 from the north after vehicle 110a, turns left at intersection 100, and goes east. Vehicle 110c comes to intersection 100 from the south, turns left at intersection 100, and goes west. A set of simulation parameters, such as initial positions, initial speeds, initial directions, and destinations of vehicles 110a, 110b, and 110c, is used as initial parameters of a simulation. A simulator calculates positions of vehicles 110a, 110b, and 110c iteratively for each time step in the simulation time period. The positions of vehicle 110a for each time step are illustrated by circle marks, the positions of vehicle 110b for each time step are illustrated by triangle marks, and the positions of vehicle 110c for each time step is illustrated by "X" marks.

Suppose a situation in which an automatic driving (AD) program or logic for AD vehicles is under development. In this case, at least one of the vehicles, vehicle $110c$ for this example, is an AD vehicle. For each time step, the simulator calculates the positions of the non-AD vehicles $110a$ and $110b$ and provides the AD program or logic of AD vehicle $110c$ with statuses of non-AD vehicles $110a$ and $110b$. Then, the AD program or logic is executed to determine behaviors of AD vehicle $110c$.

FIG. 2 shows an example of datasets according to an embodiment of the present invention. The table of FIG. 2 includes a plurality of datasets, and each dataset is shown in each row of the table. Each dataset relates to one simulation experiment such as a simulation experiment shown in FIG. 1. Each dataset includes simulation parameters, time series data, and a label.

A set of simulation parameters is a set of initial parameters used for corresponding simulation experiment. These simulation parameters may include initial statuses of objects to be simulated. Each simulation parameter may be a real value, an integer value, or a value in any other format. In this example, simulation parameters represent initial parameters of at least two vehicles, and include initial statuses (e.g., position, direction, speed, destination, and so on) of vehicles 1 to 3 such as vehicles $100a$-$c$ shown in FIG. 1.

The time series data represents a simulation status for each time step. During a simulation by using the corresponding set of simulation parameters, a simulator calculates at least one of behaviors or statuses of simulated objects, and outputs one or more simulation statuses for each time step. Each piece of time series data for each time may be a real value, an integer value, or a value in any other format. In this example, the time series data represents reacting results of the at least two vehicles during movements of the at least two vehicles. The simulator outputs a simulation status representing a reacting result of AD vehicle $110c$ for each time step. "1" represents that AD vehicle $110c$ does not react to any other vehicles at this time step ("No-reacting"). "2" represents that AD vehicle $110c$ reacts to another vehicle at this time step ("Single-reacting"). "3" represents that AD vehicle $110c$ reacts to two or more vehicles at this time step ("Multi-reacting"). "4" represents that AD vehicle $110c$ collides with one or more vehicles ("Collision").

The label represents a simulation result of the simulation period. The label represents an overall result of the simulation, and may represent a category of at least one of behaviors or statuses of simulated objects. The label may be a real value, an integer value, or a value in any other format. The simulator may determine the label in response to the end of the corresponding simulation. In another implementation, a user such as an experimenter may assign a label after analyzing the time series data, or at least one of the behaviors or status changes of simulated objects. In this example, the label represents whether AD vehicle $110c$ encounters a multi-reacting collision, or a degree of risk that AD vehicle $110c$ encounters a multi-reacting collision. "0" represents "N/A" (e.g., unrealistic situation such as two or more vehicles are initially at a same position or another restriction is violated). "1" represents that AD vehicle $110c$ does not react to any other vehicles during the simulation period ("No-reacting"). "2" represents that AD vehicle $110c$ has reacted to another vehicle at some time steps, but has not encountered higher risks ("Single-reacting"). "3" represents that AD vehicle $110c$ has reacted to two or more vehicles at some time steps, but has not encountered higher risks ("Multi-reacting"). "4" represents that AD vehicle $110c$ collides with one or more vehicles in response to reacting to another vehicle ("Single-reacting collision"). "5" represents that AD vehicle $110c$ collides with one or more vehicles in response to reacting to two or more vehicles. The simulator may assign "5" to the label if "Collision (4)" occurs after "Multi-reacting (3)" in the time series data.

To develop a reliable AD program, it is needed to test the AD program by using a large number of sets of simulation parameters. Especially, many sets of simulation parameters that may cause unusual collisions such as multi-reacting collisions are needed. However, the number of combinations of parameter values may be extremely large, and therefore it may be impractical to simulate with all combinations.

Figure 3:
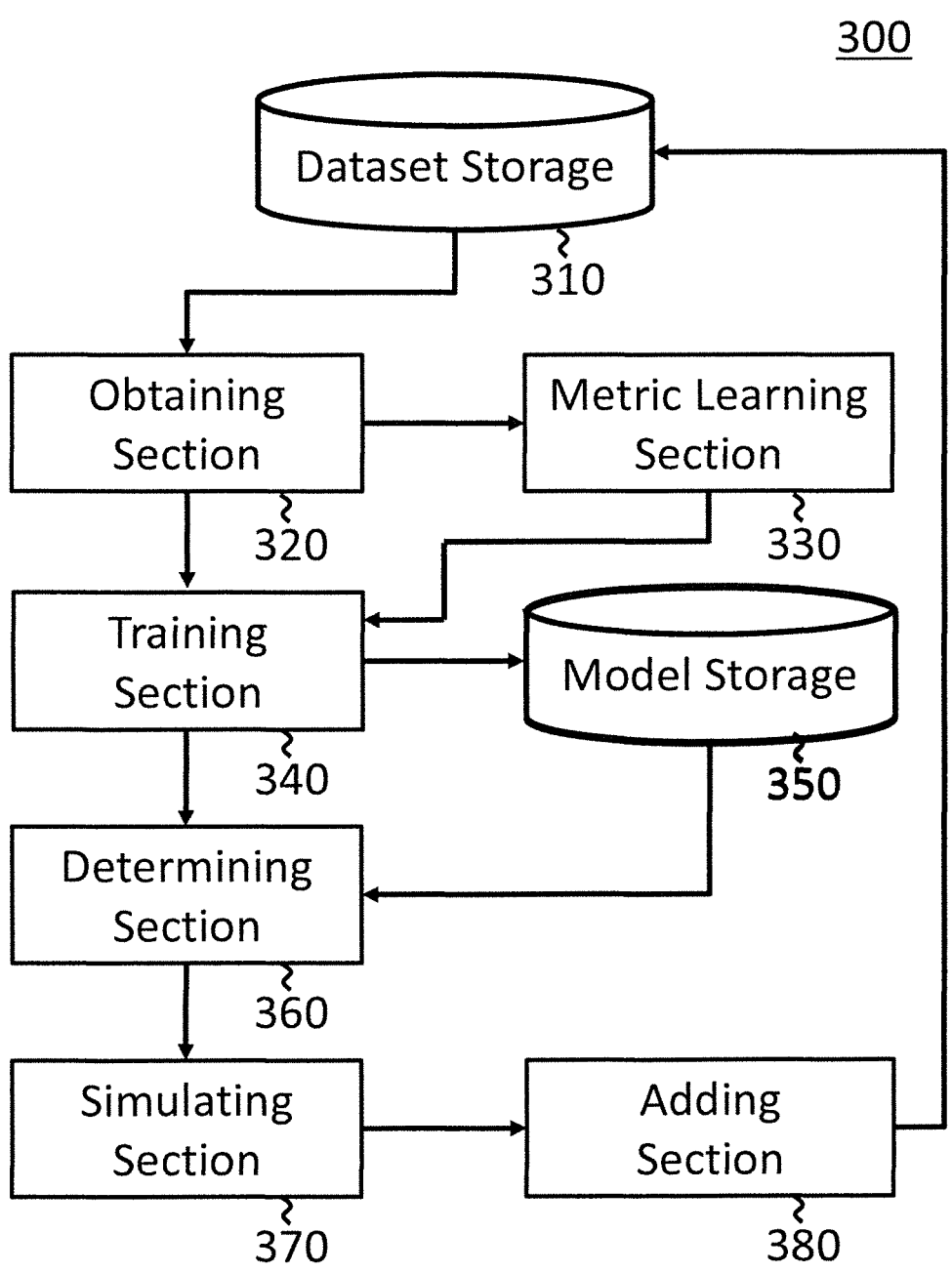
FIG. 3 shows an apparatus according to an embodiment of the present invention.

FIG. 3 shows apparatus 300 according to an embodiment of the present invention. Apparatus 300 predicts simulation parameters that may cause a certain label as a result of simulation by using the predicted simulation parameters before running a simulation with the predicted simulation parameters. Apparatus 300 includes dataset storage 310, obtaining section 320, metric learning section 330, training section 340, and model storage 350.

Dataset storage 310 stores the plurality of datasets each of which includes simulation parameters, time series data, and a label. In this embodiment, dataset storage 310 stores the table shown in FIG. 2. In another embodiment, dataset storage 310 may be remote disk storage or cloud storage located outside of apparatus 300.

Obtaining section 320 is connected to dataset storage 310. Obtaining section 320 obtains the plurality of datasets stored in dataset storage 310.

Metric learning section 330 is connected to obtaining section 320. Metric learning section 330 receives the plurality of datasets from obtaining section 320, and learns a metric of the simulation parameters of at least two datasets of the plurality of datasets. This metric imitates the similarity of time series data of the at least two datasets. In this embodiment, this metric is defined between two sets of simulation parameters of two datasets, and imitates the similarity of time series data of two datasets. This metric can be regarded as a distance or a dissimilarity of two sets of simulation parameters having higher value if the similarity of time series data of two datasets is lower, and lower value if the similarity of time series data of two dataset is higher. In another embodiment, the metric may be regarded as a similarity or a closeness of two sets of simulation parameters having higher value if the similarity of time series data of two datasets is higher, and lower value if the similarity of time series data of two dataset is lower.

Training section 340 is connected to obtaining section 320 and metric learning section 330. Training section 340 trains the model for predicting the label for simulation parameters by using the metric. Here, the plurality of datasets includes, in each dataset, a set of simulation parameters and a label for the corresponding set of simulation parameters. The model is trained to output, in response to a set of simulation parameters in one of the datasets stored in dataset storage 310, a label identical to or close to the label of the same dataset. The model is also trained to output, in response to a new set of simulation parameters, a label interpolated from at least one label of the set of simulation parameters in dataset storage 310 based on the metric between the new set of simulation parameters and the set of simulation parameters in dataset storage 310. Training section 340 sends the trained model to model storage 350. Model storage 350 is connected to training section 340 and stores the model.

Apparatus 300 may also include determining section 360. Determining section 360 is connected to training section 340 and model storage 350. Determining section 360 determines new simulation parameters by using the model stored in model storage 350 in response to training section 340 having trained the model. To predict a new set of simulation parameters that causes a certain label as a result of simulation, determining section 360 may search for a set of simulation parameters that causes the model in the model storage 350 to output a label identical to the certain label or within a certain range including the certain label. For example, to predict a new set of simulation parameters that causes vehicle 110c to encounter a "multi-reacting collision," determining section 360 may search for a set of simulation parameters that causes the model to output a label having a value of 5 or a value within a range from 4.5 to 5.5.

Apparatus 300 may also include simulating section 370 and adding section 380. Simulating section 370 is connected to determining section 360. Simulating section 370 performs a simulation for the new simulation parameters to obtain new time series data and a new label for the new simulation parameters. In another embodiment, simulating section 370 is not included in apparatus 300.

Adding section 380 is connected to simulating section 370. Adding section 380 adds a new dataset including the new simulation parameters, the new time series data and the new label to the plurality of datasets stored in dataset storage 310. After a new dataset is added in dataset storage 310, metric learning section 330 can further learn the metric, and training section 340 can further train the model in model storage 350 to improve the accuracy of predicting a set of simulation parameters.

In this embodiment, apparatus 300 can generate a model that can predict a label from a set of simulation parameters. If determining section 360 is included in apparatus 300, apparatus 300 can predict new sets of simulation parameters that may cause a certain label as a result of a simulation without running a simulation. Therefore, apparatus 300 can reduce the computational cost for obtaining new sets of simulation parameters.

Figure 4:
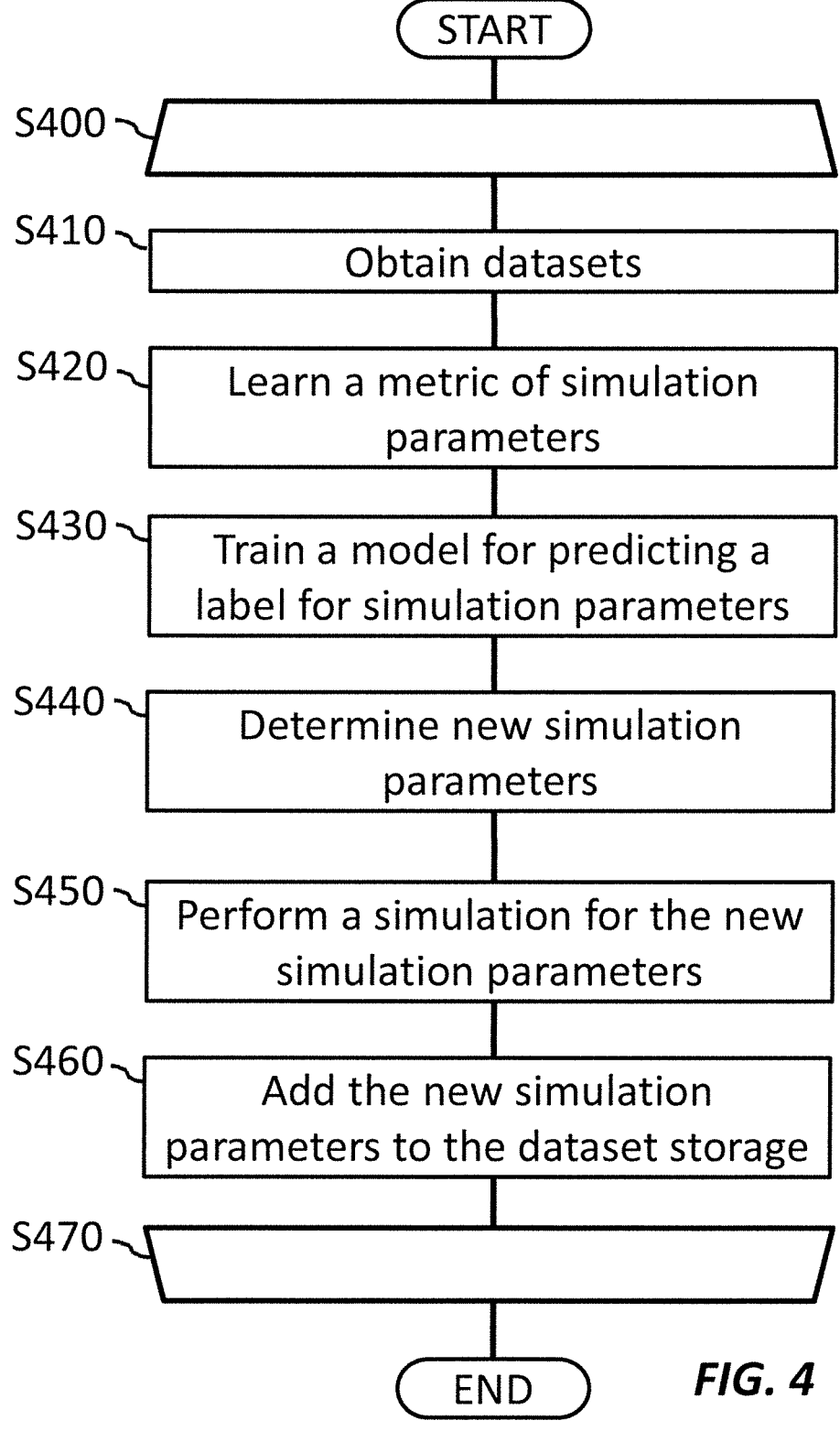
FIG. 4 shows an operational flow according to an embodiment of the present invention.

FIG. 4 shows an operational flow according to an embodiment of the present invention. The operations of FIG. 4 can be performed by, for example, apparatus 300 and its components that were explained in reference to FIG. 3. While the operational flow of FIG. 4 will be explained in reference to apparatus 300 and its components, the operational flow can be performed by other apparatus having different components as well.

Apparatus 300 repeats operations between S400 (Step 400) and S470 for predetermined times, and apparatus 300 adds a new dataset by performing each iteration including S420 to S460. At S410, obtaining section 320 obtains the plurality of datasets stored in dataset storage 310.

At S420, metric learning section 330 learns a metric of the simulation parameters of at least two datasets. In this embodiment, the metric is calculated based on a difference of simulation parameters of the at least two datasets and a set of weights. For example, the metric between a set of simulation parameters of dataset i (also referred to as "vector $x_i$") and a set of simulation parameters of dataset j (also referred to as "vector $x_j$") can be regarded as a distance defined by the following expression (1).

$$\text{distance}(x_i, x_j) = (x_i - x_j)^T W(x_i - x_j) \tag{1}$$

Vectors $x_i$ and $x_j$ have vector elements 1 to N which are simulation parameters 1 to N of datasets i and j respectively. W is a weight matrix of N rows and N columns. In this implementation, W is a diagonal matrix. In this case, each dimension of difference $(x_i - x_j)$ is weighted by a corresponding weight value in W, meaning that the importance of each dimension can be reflected in the distance function. In another implementation, W may be a non-diagonal matrix.

Metric learning section 330 performs optimization of W to obtain an optimal metric (i.e. distance function) for predicting a new set of simulation parameters. For this purpose, metric learning section 330 updates the set of weights to imitate the similarity of time series data of the at least two datasets. Metric learning section 330 can use any kind of calculation of similarities to calculate the similarity of time series data. For example, metric learning section 330 can calculate the similarity of time series data of two datasets i and j by using dynamic time warping of time series data as shown in the following expression (2).

$$s_{i,j} = \text{DynamicTimeWarp}(s_i, s_j) \tag{2}$$

Here, $s_i$ and $s_j$ are time series data of datasets i and j, respectively. DynamicTimeWarp( ) is a function that calculates a distance (i.e. "similarity" in the broadest sense) between two time series data by using dynamic time warping. Details of dynamic time warping are disclosed in, as an example, the following reference.

Thanawin Rakthanmanon, et al.,"Data mining a trillion time series subsequences under dynamic time warping," IJCAI International Joint Conference on Artificial Intelligence, pages 3047-3051, 2013.

Metric learning section 330 determines the weight matrix W to approximate distance $(x_i, x_j)$ to $s_{i,j}$ for all combinations (or at least two combinations) of datasets i and j. For example, metric learning section 330 determines the weight matrix W as shown in the following equation (3).

$$W = \underset{W'}{argmin} \sum_{i,j} \mathcal{L}((x_i - x_j)^T W'(x_i - x_j),\ s_{i,j}) \tag{3}$$

The function $\mathcal{L}(\alpha, \beta)$ is an absolute error between $\alpha$ and $\beta$. The function $\mathcal{L}(\alpha, \beta)$ may include one or more regularization terms, such as regularization terms L1 and L2, to obtain appropriate matrix W to, for example, keep matrix elements as small as possible. By expression (3), metric learning section 330 can determine the weight matrix W that can minimize the total absolute error between distances calculated by expression (1) and respective similarities calculated by expression (2). In another implementation, metric learning section 330 may try to approximate the metric of two datasets to the similarity of time series data of the same datasets, but may not reach the optimal W due to a shortage of computational resources or time. Apparatus 300 can also use such metric as a preferable metric.

At S430, training section 340 trains the model by using the metric learned by metric learning section 330, and stores the trained model in model storage 350. In this embodiment, training section 340 uses a Gaussian process GP as a response-surface model to map input parameters x to labels y using a radial basis function (RBF) kernel based on the learned metric. For example, training section 340 can use the radial basis function kernel shown in the following expression (4).

$$\exp(-a \cdot (x_i - x_j)^T W(x_i - x_j)) \tag{4}$$

a is a scale parameter, which is a setting parameter of this operational flow. In another embodiment, training section 340 may optimize the value of a or search for a preferable value of a among multiple settings based on the prediction accuracy of the model.

At S440, determining section 360 determines new simulation parameters by using the model stored in model storage 350 in response to training section 340 having trained the model. Since the model can predict a label y from a candidate set of simulation parameters x by calculating y=GP(x,W), determining section 360 can search for a set of simulation parameters x that causes the model to output a label y that is identical to the target label or in a certain range from the target label.

If the target label is the highest value among available labels, determining section 360 can search for a set of simulation parameters x that causes the model to output a label y that is higher than a threshold. This threshold can be identical to or lower than the target label, and may be higher than any other labels. If the target label is the lowest value among available labels, determining section 360 can search for a set of simulation parameters x that causes the model to output a label y that is lower than a threshold. This threshold can be identical to or higher than the target label, and may be lower than any other labels.

For example, with respect to the simulation relating to FIGS. 1 and 2, determining section 360 may determine new simulation parameters that cause the model to predict a label representing a multi-reacting collision. In this case, determining section 360 may search for a set of simulation parameters x that causes the model to output a label y higher than 4.5. Such set of simulation parameters is likely to cause multi-reacting collision in a simulation.

In another embodiment, determining section 360 may determine a new set of simulation parameters that is predicted to cause the simulation to output any of two or more target labels. In this case, determining section 360 searches for a set of simulation parameters that causes the model to output a label within ranges defined to cover the two or more target labels.

At S450, simulating section 370 performs a simulation for the new simulation parameters and obtains new time series data and a new label for the new simulation parameters. If the model is well trained, the simulation result can be categorized in the target label.

At S460, adding section 380 adds a new dataset including the new simulation parameters determined by determining section 360, and the new time series data and the new label obtained by the simulation to the plurality of datasets stored in dataset storage 310. Adding section 380 can add a new dataset including a new label different from the target label as well as a new dataset including a new label that is identical to the target label.

In this embodiment, apparatus 300 can learn the metric that imitates the similarity of time series data obtained from sets of simulation parameters. Since simulation results are correlated with time series data at least to some extent, apparatus 300 can generate a good model for predicting labels from sets of simulation parameters by training the model using the metric.

Apparatus 300 can predict new sets of simulation parameters by using the model without performing a simulation. Apparatus 300 can select candidate sets of simulation parameters that are likely to cause the simulator to output a certain result and discard other candidate sets. Therefore, apparatus 300 can reduce the number of executions of simulations, and thereby reduce computational resources and time to find sets of simulation parameters.

In this embodiment, apparatus 300 adds, to dataset storage 310, new datasets including new sets of simulation parameters and labels as results of simulations, and trains the model by using the plurality of datasets including the new datasets. By increasing the number of datasets in dataset storage 310, apparatus 300 can improve the accuracy of the model.

Figure 5:
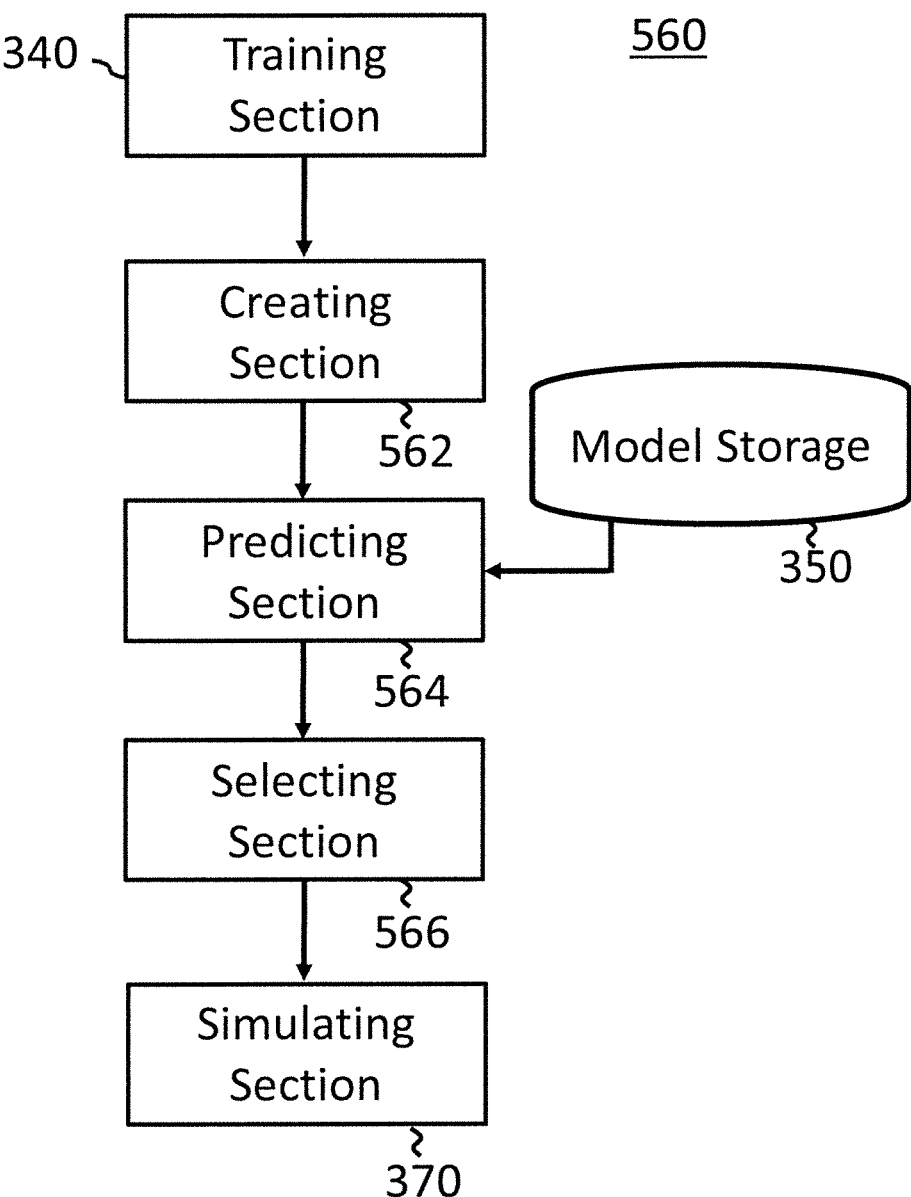
FIG. 5 shows a structure of a determining section according to an embodiment of the present invention.

FIG. 5 shows a structure of determining section 560 according to an embodiment of the present invention. Determining section 560 of FIG. 5 may be a detailed version of determining section 360 in FIG. 3 or may be different from determining section 360. While determining section 560 of FIG. 5 will be explained in reference to apparatus 300 of FIG. 3 and its components, determining section 560 can be implemented in other apparatuses having different components as well.

In this embodiment, determining section 560 searches for at least one set of simulation parameters by selecting the at least one set of simulation parameters from candidate sets of simulation parameters. In this way, determining section 560 can select the at least one set of simulation parameters that is most likely to cause the simulator to output the target label among the candidate sets of simulation parameters.

Determining section 560 includes creating section 562, predicting section 564, and selecting section 566. Creating section 562 is connected to a training section such as training section 340. Creating section 562 creates a plurality of candidate sets of simulation parameters. The number of candidate sets created in each iteration may be, for example, preset by a user or an experimenter.

Predicting section 564 is connected to creating section 562 and model storage such as model storage 350. Predicting section 564 receives the plurality of candidate sets of simulation parameters from creating section 562. Predicting section 564 receives the model stored in model storage 350. For each candidate set of simulation parameters x, predicting section 564 predicts a label for the candidate set by using the model.

Selecting section 566 is connected to predicting section 564. Selecting section 566 receives the plurality of candidate sets of simulation parameters and predicted labels. Selecting section 566 selects one or more candidate sets which are within ranges including the target label, or which are nearest to the target label. Selecting section 566 sends, to a simulating section such as simulating section 370, the selected one or more candidate sets of simulation parameters as one or more new sets of simulation parameters.

Figure 6:
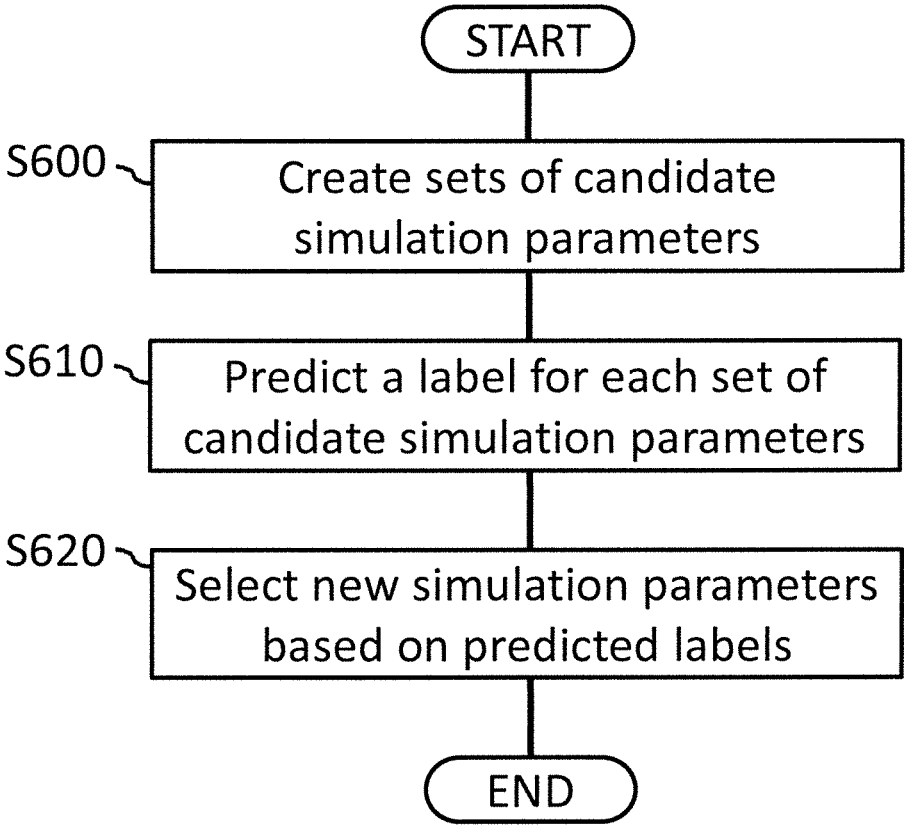
FIG. 6 shows an operational flow of a determining section according to an embodiment of the present invention.

FIG. 6 shows an operational flow of a determining section according to an embodiment of the present invention. The operations of FIG. 6 can be performed by, for example, determining section 560 and its components that were explained in reference to FIG. 5. While the operational flow of FIG. 6 will be explained in reference to determining section 560 and its components, the operational flow can be performed by other determining sections having different components as well.

At S600, creating section 562 creates a plurality of candidate sets of simulation parameters. In an implementation, creating section 562 creates each candidate set of simulation parameters by determining each simulation parameter based on a random value within a valid range of the corresponding simulation parameter. Creating section 562 may receive sets of simulation parameters in the plurality of datasets stored in dataset storage 310 through training section 340, and may also create some candidate sets of simulation parameters in an area where the density of sets of simulation parameters in dataset storage 310 is lowest or lower than a threshold.

At S610, predicting section 564 predicts, for each candidate set of simulation parameters x, a label y for the candidate set by using the model. In this embodiment, predicting section 564 predicts the label y by calculating y=GP(x,W).

At S620, selecting section 566 selects the new simulation parameters from at least two sets of candidate simulation parameters. Selecting section 566 may select one or more sets of candidate simulation parameters where the corresponding predicted label is nearest to the target label or corresponding predicted label falls within a certain range from the target label.

In this embodiment, determining section 560 determines the new simulation parameters that maximize the label predicted by the model. In this case, predicting section 564 may predict the label y by calculating an expected label (or a mean of the predicted label) GP(x,W) and a standard deviation of the predicted label $\sigma_{GP}$(x,W). The expected label GP(x,W) and the standard deviation $\sigma_{GP}$(x,W) can be calculated based on similarities between the set of candidate simulation parameters and each set of simulation parameters in dataset storage 310, labels in dataset storage 310, and a covariance matrix including similarities between sets of simulation parameters in dataset storage 310 as matrix elements.

By using the expected label GP(x,W) and the standard deviation $\sigma_{GP}$(x,W), selecting section 566 can determine the new set of simulation parameters $x'_p$ by using the following expression (5).

$$x'_p = \underset{x'}{argmax}(GP(x', W) + k\sigma_{GP}(x', W)) \qquad (5)$$

By using expression (5), selecting section 566 can select a set of new simulation parameters that is likely to cause the highest label among the candidate sets of new simulation parameters with considering the posterior distribution of the predicted label. k is a setting value that sets the degree of influence of the standard deviation $\sigma_{GP}$(x,W). If k is 1, +1$\sigma$ is expected, and if k is 3, +3$\sigma$ is expected. Selecting section 566 may select n sets of new simulation parameters by selecting n candidate sets among the plurality of candidate sets that causes the n-highest GP(x',W)+k$\sigma_{GP}$(x',W) in expression (5).

In another embodiment, determining section 560 determines the new simulation parameters that minimize the label predicted by the model. In this case, selecting section 566 changes "arg max" in expression (5) to "arg min."

In the embodiment of FIG. 5 and FIG. 6, determining section 560 can create candidate sets of simulation parameters and select one or a part of the candidate sets as a new set of simulation parameters by using the model. Therefore, determining section 560 does not need to try every combination of simulation parameter values to search for new sets of simulation parameters that cause the target label in a simulation. If the standard deviation is also considered, determining section 560 can select new sets of simulation parameters more accurately.

Figure 7:
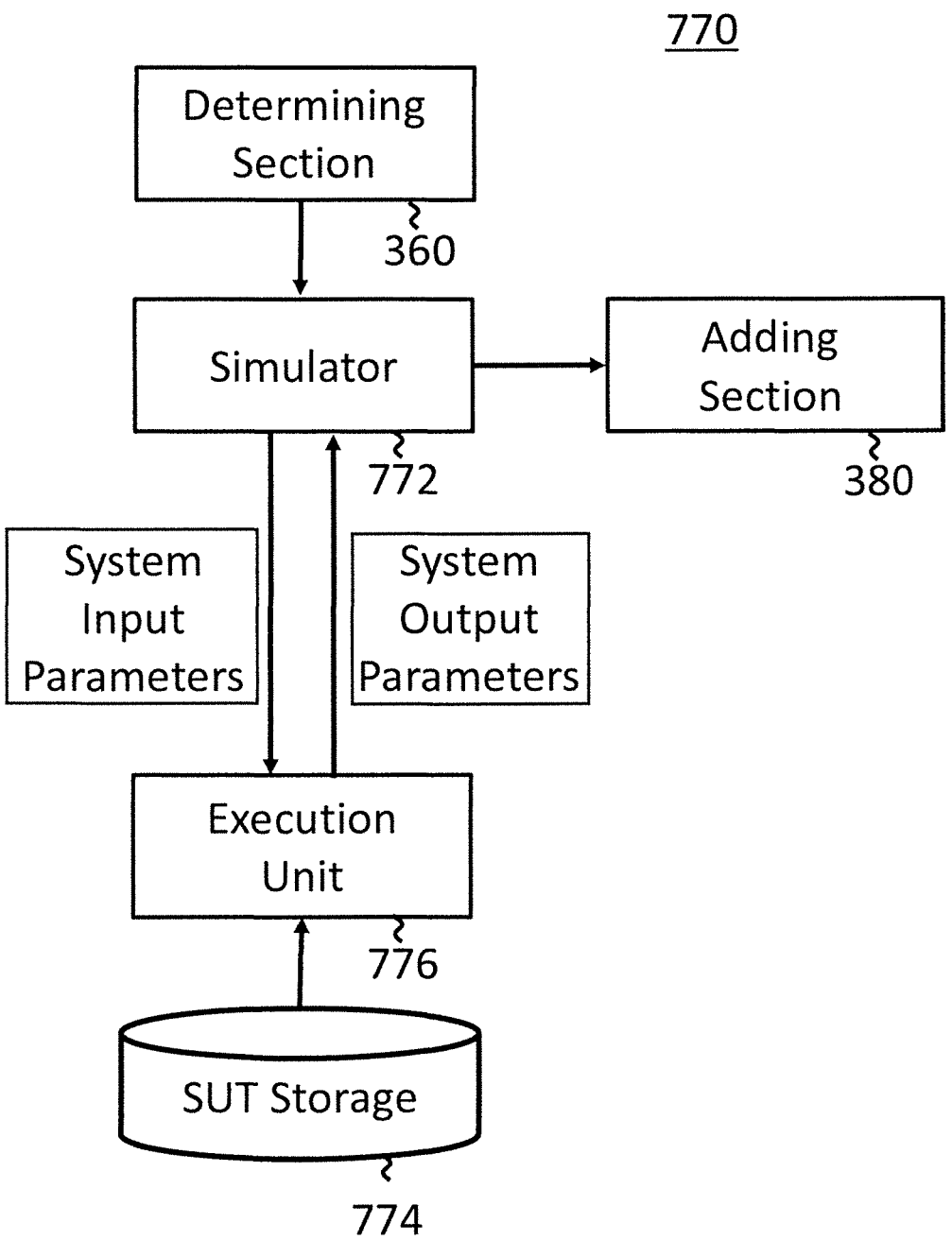
FIG. 7 shows a structure of a simulation section according to an embodiment of the present invention.

FIG. 7 shows a structure of simulation section 770 according to an embodiment of the present invention. Simulating section 770 of FIG. 7 may be a detailed version of simulating section 370 in FIG. 3 or may be different from simulating section 370. While simulating section 770 of FIG. 7 will be explained in reference to apparatus 300 of FIG. 3 and its components, simulating section 770 can be implemented in other apparatuses having different components as well.

In this embodiment, a system under test (SUT) for at least one object can be attached to simulator 772 in simulating section 770, and simulator 772 can obtain behaviors of SUT while simulating other objects. Simulating section 770 includes simulator 772, SUT storage 774, and execution unit 776.

Simulator 772 is connected to a determining section such as determining section 360 in FIG. 3. Simulator 772 receives one or more new set of simulation parameters, and performs a simulation for each of the new set. In this simulation, simulator 772 simulates at least one of behaviors or status changes of objects except for objects handled by one or more SUT. In response to the completion of the simulation, simulator 772 sends the time series data and the label to an adding section such as adding section 380 in FIG. 3.

SUT storage 774 stores at least one of an SUT program or SUT data relating to an SUT. In the example of FIGS. 1 and 2, reactions and collisions of at least two vehicles such as vehicles 110*a*, 110*b*, and 110*c* are tested, and the at least two vehicles include an automated driving vehicle such as vehicle 110*c*. The SUT is a system developed for controlling AD vehicles as an example. The SUT may be a program, an algorithm, or a trained model such as a neural network, a Markov model, or any other machine learning model.

In another embodiment, the SUT may include hardware such as a circuit, a device, or a computer system. In this case, the hardware SUT is connected to simulating section 770 instead of storing a software SUT in SUT storage 774.

Execution unit 776 obtains the SUT program or the SUT data from SUT storage 774. Execution unit 776 executes the SUT program, or executes SUT operations based on the SUT data. For executing the SUT, execution unit 776 receives, from simulator 772, parameters to be monitored by the SUT, and provides these parameters (system input parameters) with the SUT program or the SUT operations. For example, execution unit 776 may receive the behaviors or statuses of other vehicles such as vehicles 110*a* and 110*b* and provide them with the SUT controlling vehicle 110*c*. Execution unit 776 sends output parameters of the SUT, which are results of executing the SUT program or the SUT operations, to simulator 772.

Figure 8:
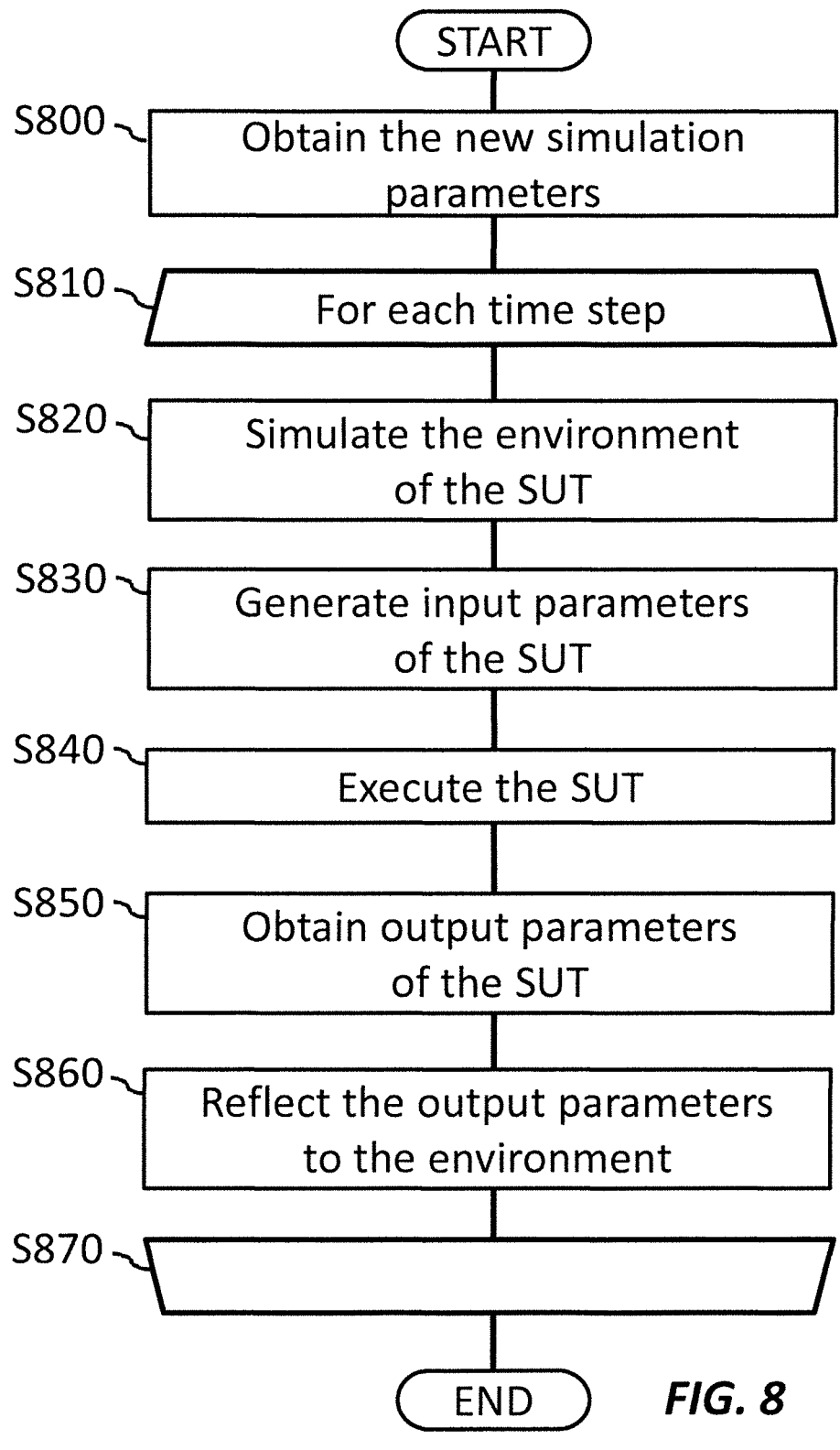
FIG. 8 shows an operational flow of a simulation section according to an embodiment of the present invention.

FIG. 8 shows an operational flow of a simulation section according to an embodiment of the present invention. The operations of FIG. 8 can be performed by, for example, simulating section 770 and its components that were explained in reference to FIG. 7. While the operational flow of FIG. 8 will be explained in reference to simulating section 770 and its components, the operational flow can be performed by other apparatus having different components as well.

At S800, simulator 772 obtains a new set of simulation parameters from determining section 360. Simulating section 770 starts a simulation from a start time, and performs S820 to S860 for each time step until the simulation is completed (S810 and S870).

At S820, simulator 772 simulates the environment of the SUT (i.e. any objects that are not controlled by the SUT). In more detail, simulator 772 simulates at least one of behaviors or status changes of objects that are not controlled by the SUT (referred to as "non-SUT objects") based on at least one of behaviors or statuses of all objects at previous time step.

At S830, simulator 772 generates input parameters for the SUT at this time step based on at least one of behaviors or statuses of non-SUT objects at previous time step. The input parameters may include locations, speeds, and directions of other vehicles detectable from the AD vehicle. For this purpose, simulator 772 may convert parameters in simulator 772 to suitable input parameters for the SUT by changing the format or representation of parameters.

At S840, execution unit 776 provides the input parameters with the SUT program or the SUT operations stored in SUT storage 774, and executes the SUT program or the SUT operations for this time step based on the input parameters of this time step.

At S850, SUT storage 774 sends the output parameters of the SUT to simulator 772. The output parameters may include a location, a speed, and a direction of the AD vehicle.

At S860, simulator 772 obtains the output parameters of the SUT, and reflects the output parameters to the simulation environment. For this purpose, simulator 772 may convert output parameters from execution unit 776 to suitable parameters by changing the format or representation of parameters.

In this embodiment, simulating section 770 can run the simulation and execute the SUT concurrently or in parallel. In this way, simulating section 770 can perform the simulation including simulating behaviors of the automated driving vehicle as an example. Therefore, the apparatus such as apparatus 300 can test an SUT identical to the system implemented in real vehicles or any other machinery.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
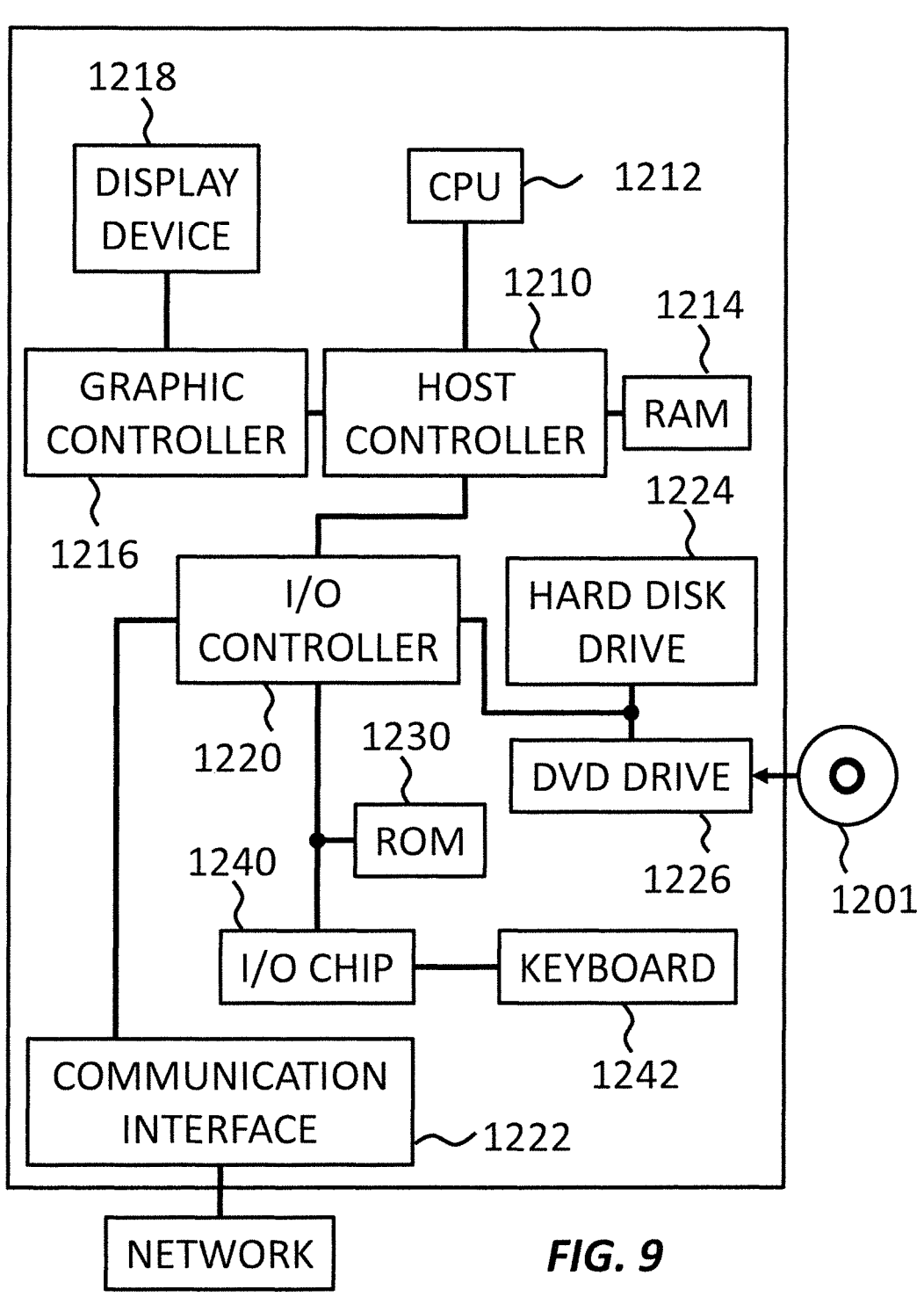
FIG. 9 shows an exemplary hardware configuration of a computer according to an embodiment of the present invention.

FIG. 9 shows an example of a computer 1200 in which aspects of the present invention may be wholly or partly embodied. A program that is installed in the computer 1200 can cause the computer 1200 to function as or perform operations associated with apparatuses of the embodiments of the present invention or one or more sections thereof, and/or cause the computer 1200 to perform processes of the embodiments of the present invention or steps thereof. Such a program may be executed by the CPU 1212 to cause the computer 1200 to perform certain operations associated with some or all of the blocks of flowcharts and block diagrams described herein.

The computer 1200 according to the present embodiment includes a CPU 1212, a RAM 1214, a graphics controller 1216, and a display device 1218, which are mutually connected by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 through an input/output chip 1240.

The CPU 1212 operates according to programs stored in the ROM 1230 and the RAM 1214, thereby controlling each unit. The graphics controller 1216 obtains image data generated by the CPU 1212 on a frame buffer or the like provided in the RAM 1214 or in itself, and causes the image data to be displayed on the display device 1218.

The communication interface 1222 communicates with other electronic devices via a network. The hard disk drive 1224 stores programs and data used by the CPU 1212 within the computer 1200. The DVD-ROM drive 1226 reads the programs or the data from the DVD-ROM 1201, and provides the hard disk drive 1224 with the programs or the data via the RAM 1214. The IC card drive reads programs and data from an IC card, and/or writes programs and data into the IC card.

The ROM 1230 stores therein a boot program or the like executed by the computer 1200 at the time of activation, and/or a program depending on the hardware of the computer 1200. The input/output chip 1240 may also connect various input/output units via a parallel port, a serial port, a keyboard port, a mouse port, and the like to the input/output controller 1220.

A program is provided by computer readable media such as the DVD-ROM 1201 or the IC card. The program is read from the computer readable media, installed into the hard disk drive 1224, RAM 1214, or ROM 1230, which are also examples of computer readable media, and executed by the CPU 1212. The information processing described in these programs is read into the computer 1200, resulting in cooperation between a program and the above-mentioned various types of hardware resources. An apparatus or method may be constituted by realizing the operation or processing of information in accordance with the usage of the computer 1200.

For example, when communication is performed between the computer 1200 and an external device, the CPU 1212 may execute a communication program loaded onto the RAM 1214 to instruct communication processing to the communication interface 1222, based on the processing described in the communication program. The communication interface 1222, under control of the CPU 1212, reads transmission data stored on a transmission buffering region provided in a recording medium such as the RAM 1214, the hard disk drive 1224, the DVD-ROM 1201, or the IC card, and transmits the read transmission data to a network or writes reception data received from a network to a reception buffering region or the like provided on the recording medium.

In addition, the CPU 1212 may cause all or a necessary portion of a file or a database to be read into the RAM 1214, the file or the database having been stored in an external recording medium such as the hard disk drive 1224, the DVD-ROM drive 1226 (DVD-ROM 1201), the IC card, etc., and perform various types of processing on the data on the RAM 1214. The CPU 1212 may then write back the processed data to the external recording medium.

Various types of information, such as various types of programs, data, tables, and databases, may be stored in the recording medium to undergo information processing. The CPU 1212 may perform various types of processing on the data read from the RAM 1214, which includes various types of operations, processing of information, condition judging, conditional branch, unconditional branch, search/replace of information, etc., as described throughout this disclosure and designated by an instruction sequence of programs, and writes the result back to the RAM 1214. In addition, the CPU 1212 may search for information in a file, a database, etc., in the recording medium. For example, when a plurality of entries, each having an attribute value of a first attribute associated with an attribute value of a second attribute, are stored in the recording medium, the CPU 1212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 1200. In addition, a recording medium such as a hard disk or a RAM provided in a server system connected to a dedicated communication network or the Internet can be used as the computer readable media, thereby providing the program to the computer 1200 via the network.

While the embodiments of the present invention have been described, the technical scope of the invention is not limited to the above described embodiments. It will be apparent to persons skilled in the art that various alterations and improvements can be added to the above-described embodiments. It should also apparent from the scope of the claims that the embodiments added with such alterations or improvements are within the technical scope of the invention.

Many of the embodiments of the present invention include artificial intelligence, and include neural networks in particular. Some of the foregoing embodiments describe specific types of neural networks. However, a neural network usually starts as a configuration of random values. Such untrained neural networks must be trained before they can be reasonably expected to perform a function with success. Once trained, a neural network may not need further training. In this way, a trained neural network is a product of the process of training an untrained neural network.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A computer-implemented method comprising:

increasing prediction accuracy while reducing computational resource consumption of a system under test (SUT) for automated driving vehicles by iteratively training the SUT to adapt to real-world traffic environments and obtain a trained SUT by:

obtaining a plurality of datasets, each dataset including previously predicted simulation parameters obtained by prediction without simulation, time series data and a label relating to autonomous vehicle operation, wherein the time series data represents a simulation status for each time step and the label represents a simulation result;

learning a metric of the previously predicted simulation parameters of at least two datasets of the plurality of datasets, by determining, with a neural network model, a weight matrix that can minimize a total absolute error between distances between sets of simulation parameters for different datasets and a similarity of the time series data of the different datasets through dynamic time warping by utilizing one or more regularization terms to regularize matrix elements of the weight matrix, wherein the metric imitates the similarity of the time series data;

training the neural network model of the SUT to predict a label for car driving simulation parameters without performing a current simulation by:

mapping previously predicted simulation parameters of the at least two datasets to labels using a radial basis function kernel based on the metric and a Gaussian process as a response-surface model;

searching for a preferable value of a scaling factor among multiple settings based on a prediction accuracy of the neural network model;

determining, with the neural network model, new car driving simulation parameters that causes the SUT of the automated driving vehicles to output one or more labels for the car driving simulation parameters that represent degrees of risk of an undesirable event for the automated driving vehicles involving movement of other vehicles in a traffic scene based on the label predicted for the car driving simulation parameters; and controlling, with the trained SUT, a vehicle speed system and a vehicle steering system to respectively control a speed and a direction of an automated driving vehicle to react to the degrees of risk and avoid the undesirable event based on the new car driving simulation parameters responsive to one or more labels output from the trained neural network model that correspond to behaviors in real-world traffic environments.

2. The computer-implemented method of claim 1, wherein the metric is calculated based on a difference of simulation parameters of the at least two datasets and a set of weights, and the learning updates the set of weights to imitate the similarity of time series data of the at least two datasets.

3. The computer-implemented method of claim 1, further comprising determining new simulation parameters that maximize the label predicted by the neural network model.

4. The computer-implemented method of claim 1, further comprising determining new simulation parameters that minimize the label predicted by the neural network model.

5. The computer-implemented method of claim 1, further comprising determining new simulation parameters by selecting the new simulation parameters from at least two sets of candidate simulation parameters.

6. The computer-implemented method of claim 1, further comprising:

determining new simulation parameters by using the model;

performing a simulation for the new simulation parameters to obtain new time series data and a new label for the new simulation parameters; and adding a new dataset including the new simulation parameters, the new time series data and the new label to the plurality of datasets.

7. The computer-implemented method of claim 6, wherein the previously predicted simulation parameters represent initial parameters of at least two vehicles, and the time series data represents reacting results of the at least two vehicles during movements of the at least two vehicles including speeds and directions of the at least two vehicles.

8. The computer-implemented method of claim 7, wherein the determining includes determining the new simulation parameters that cause the model to predict a label representing a multi-reacting collision.

9. The computer-implemented method of claim 7, wherein the at least two vehicles include an automated driving vehicle, and the performing of the simulation includes simulating behaviors of the automated driving vehicle.

10. A computer program product including one or more non-transitory computer readable storage mediums collectively storing program instructions that are executable by a processor or programmable circuitry to cause the processor or programmable circuitry to perform operations comprising:

increasing prediction accuracy while reducing computational resource consumption of a system under test (SUT) for automated driving vehicles by iteratively training the SUT to adapt to real-world traffic environments and obtain a trained SUT by:

obtaining a plurality of datasets, each dataset including previously predicted simulation parameters, time series data and a label relating to autonomous vehicle operation, wherein the time series data represents a simulation status for each time step and the label represents a simulation result;

learning a metric of the previously predicted simulation parameters of at least two datasets of the plurality of datasets, by determining, with a neural network model, a weight matrix that can minimize a total absolute error between distances between sets of simulation parameters for different datasets and a similarity of the time series data of the different datasets through dynamic time warping by utilizing one or more regularization terms to regularize matrix elements of the weight matrix, wherein the metric imitates the similarity of the time series data;

training the neural network model of the SUT to predict a label for car driving simulation parameters without performing a current simulation by:

mapping previously predicted simulation parameters of the at least two datasets to labels using a radial basis function kernel based on the metric and a Gaussian process as a response-surface model;

searching for a preferable value of a scaling factor among multiple settings based on a prediction accuracy of the neural network model;

determining, with the neural network model, new car driving simulation parameters that causes the SUT of the automated driving vehicles to output one or more labels for the car driving simulation parameters that represent degrees of risk of an undesirable event for the automated driving vehicles involving movement of other vehicles in a traffic scene based on the label predicted for the car driving simulation parameters; and controlling, with the trained SUT, a vehicle speed system and a vehicle steering system to respectively control a speed and a direction of an automated driving vehicle to react to the degrees of risk and avoid the undesirable event based on the new car driving simulation parameters to one or more labels output from the trained neural network model that correspond to behaviors in real-world traffic environments.

11. The computer program product of claim 10, wherein the metric is calculated based on a difference of simulation parameters of the at least two datasets and a set of weights, and the learning updates the set of weights to imitate the similarity of time series data of the at least two datasets.

12. The computer program product of claim 10, wherein the operations further comprising determining new simulation parameters that maximize the label predicted by the trained neural network model.

13. The computer program product of claim 10, wherein the operations further comprising:

determining new simulation parameters by using the trained neural network model;

performing a simulation for the new simulation parameters to obtain new time series data and a new label for the new simulation parameters; and adding a new dataset including the new simulation parameters, the new time series data and the new label to the plurality of datasets.

14. An apparatus comprising:

a processor or a programmable circuitry; and one or more computer readable mediums collectively including instructions that, when executed by the processor or the programmable circuitry, cause the processor or the programmable circuitry to:

increase prediction accuracy while reducing computational resource consumption of a system under test (SUT) for automated driving vehicles by iteratively training the SUT to adapt to real-world traffic environments and obtain a trained SUT by:

obtain a plurality of datasets, each dataset including previously predicted simulation parameters, time series data and a label relating to autonomous vehicle operation, wherein the time series data represents a simulation status for each time step and the label represents a simulation result;

learn a metric of the previously predicted simulation parameters of at least two datasets of the plurality of datasets, by determining, with a neural network model, a weight matrix that can minimize a total absolute error between distances between sets of simulation parameters for different datasets and a similarity of the time series data of the different datasets through dynamic time warping by utilizing one or more regularization terms to regularize matrix elements of the weight matrix, wherein the metric imitates the similarity of the time series data;

train the neural network model of the SUT to predict a label for car driving simulation parameters without performing a current simulation by:

mapping previously predicted simulation parameters of the at least two datasets to labels using a radial basis function kernel based on the metric and a Gaussian process as a response-surface model;

searching for a preferable value of a scaling factor among multiple settings based on a prediction accuracy of the neural network model;

determine, with the neural network model, new car driving simulation parameters that causes the SUT of the automated driving vehicles to output one or more labels for the car driving simulation parameters that represent degrees of risk of an undesirable event for the automated driving vehicles involving movement of other vehicles in a traffic scene based on the label predicted for the car driving simulation parameters; and control, with the trained SUT, a vehicle speed system and a vehicle steering system to respectively control a speed and a direction of an automated driving vehicle to react to the degrees of risk and avoid the undesirable event based on the new car driving simulation parameters responsive to one or more labels output from the trained neural network model that correspond to behaviors in real-world traffic environments.

15. The apparatus of claim 14, wherein the metric is calculated based on a difference of simulation parameters of the at least two datasets and a set of weights, and the learning updates the set of weights to imitate the similarity of time series data of the at least two datasets.

16. The apparatus of claim 14, wherein the instructions further cause the processor or the programmable circuitry to determine new simulation parameters that maximize the label predicted by the trained neural network model.

17. The apparatus of claim 14, wherein the instructions further cause the processor or the programmable circuitry to:

determine new simulation parameters by using the trained neural network model;

perform a simulation for the new simulation parameters to obtain new time series data and a new label for the new simulation parameters; and add a new dataset including the new simulation parameters, the new time series data and the new label to the plurality of datasets.

\* \* \* \* \*